United States Patent
Jaussi et al.

(10) Patent No.: US 6,768,372 B2
(45) Date of Patent: Jul. 27, 2004

(54) ANALOG FILTER ARCHITECTURE

(75) Inventors: James E. Jaussi, Hillsboro, OR (US);
Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 10/326,954

(22) Filed: Dec. 20, 2002

(65) Prior Publication Data

US 2004/0119530 A1 Jun. 24, 2004

(51) Int. Cl.[7] .................................................. H03K 5/00
(52) U.S. Cl. ...................................... 327/552; 327/322
(58) Field of Search .............................. 327/551, 552, 327/553, 554, 555, 556, 557, 558, 559; 708/300, 303, 819, 322, 5

(56) References Cited

U.S. PATENT DOCUMENTS

| | | | | |
|---|---|---|---|---|
| 4,308,618 A | * | 12/1981 | Levy et al. .................. | 375/235 |
| 5,841,811 A | * | 11/1998 | Song .......................... | 375/235 |
| 6,621,330 B1 | * | 9/2003 | Jaussi et al. ................ | 327/552 |
| 2002/0129070 A1 | * | 9/2002 | Mallinson .................... | 708/5 |

* cited by examiner

Primary Examiner—Dinh T. Le
(74) Attorney, Agent, or Firm—Buckley, Maschoff & Talwalkar LLC (57) ABSTRACT

According to some embodiments, a device includes a phase generator to generate m control signals, each of the m control signals associated with a respective signal period, and at least m filters, each of the at least m filters comprising m-n taps, each of the m-n taps to receive one of the m control signals, to acquire a signal sample according to a signal period associated with the received control signal, and to modulate the signal sample according to a weighting coefficient associated with the tap. The device further includes m evaluation circuits, each evaluation circuit associated with a respective one of the at least m filters and to output a sum of signal samples modulated by the taps of the associated filter in response to one of the m control signals associated with a signal period other than the signal periods according to which the signal samples were acquired.

30 Claims, 8 Drawing Sheets

|  | 1 | 2 | 3 | 4 | 5 | 6 | 7 | 8 | 9 |
|---|---|---|---|---|---|---|---|---|---|
| 20a | X1*W1 | X2*W2 | X3*W3 | X4*W4 | EVAL | ACQUIRE X7 | X7*W1 | X8*W2 | X9*W3 |
| 20b | ACQUIRE X2 | X2*W1 | X3*W2 | X4*W3 | X5*W4 | EVAL | ACQUIRE X8 | X8*W1 | X9*W2 |
| 20c | EVAL | ACQUIRE X3 | X3*W1 | X4*W2 | X5*W3 | X6*W4 | EVAL | ACQUIRE X9 | X9*W1 |
| 20d | X1*W4 | EVAL | ACQUIRE X4 | X4*W1 | X5*W2 | X6*W3 | X7*W4 | EVAL | ACQUIRE X10 |
| 20e | X1*W3 | X2*W4 | EVAL | ACQUIRE X5 | X5*W1 | X6*W2 | X7*W3 | X8*W4 | EVAL |
| 20f | X1*W2 | X2*W3 | X3*W4 | EVAL | ACQUIRE X6 | X6*W1 | X7*W2 | X8*W3 | X9*W4 |

WEIGHTING CIRCUIT

BIT-CELL

ANALOG FILTER ARCHITECTURE

BACKGROUND

Small electronic circuits are often used in conjunction with high-frequency signals. However, some transmission materials used in these circuits cause significant signal loss when carrying high frequency signals. For example, signals transmitted at 3 to 4 GHz over a small portion of FR4 substrate may experience 30 to 40 dB of signal loss.

Circuit designers attempt to compensate for this loss by filtering received signals. In one example, received signals are converted to digital signals with an analog-to digital converter and then filtered using a digital filter. Analog-to-digital converters are, however, often costly and difficult to implement at high data rates. Even if analog-to-digital conversion is not problematic for a given high-frequency application, subsequent filtering of the digital high-frequency signals may itself be difficult to design and/or implement.

Analog filters may be used to address the foregoing, but power requirements of these filters usually increase with signal frequency. For example, conventional Finite Impulse Response (FIR) analog filters operate by convolving samples of a received signal with a set of weighting coefficients. A finite state machine typically performs the convolution by rotating the coefficients amongst a set of multipliers for multiplying a fixed signal sample by a weighting coefficient and/or by rotating the signal samples amongst a set of multipliers for multiplying a signal sample by a fixed weighting coefficient. The finite state machine as well as other elements used to perform the convolution adds significantly to the power requirements of the FIR filter, particularly during high-frequency operation.

DETAILED DESCRIPTION

Figure 1:
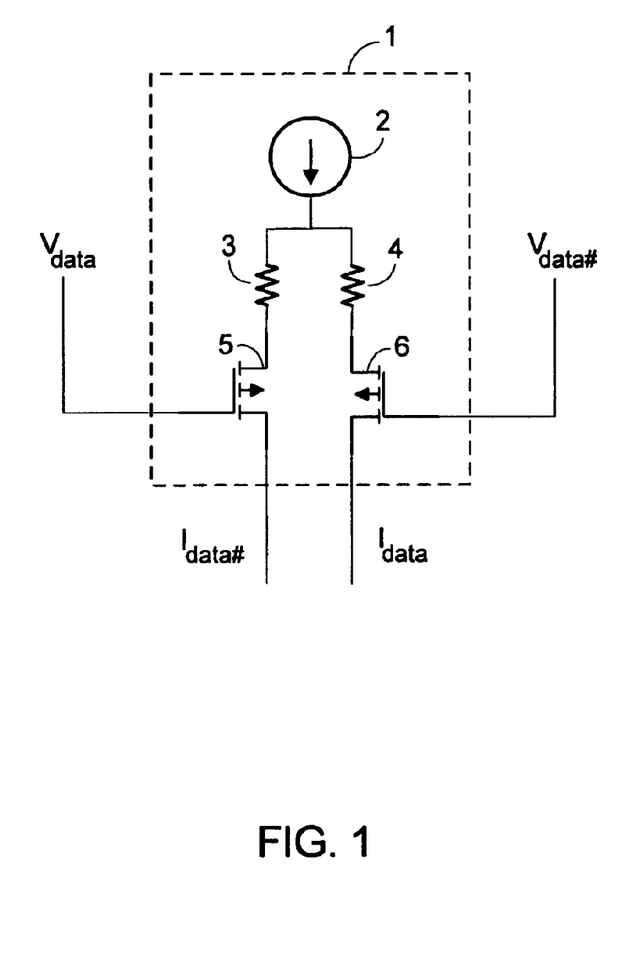
FIG. 1 is a diagram of a voltage-to-current converter according to some embodiments.

FIG. 1 is a circuit-level diagram of voltage-to-current converter 1 according to some embodiments. Voltage-to-current converter 1 is adapted to receive a ifferential-mode voltage signal represented by differential voltage signals $V_{data}$ and $V_{data\#}$. Embodiments of the present invention may operate in conjunction with other signaling modes, including single-ended and pseudo-differential.

Voltage-to-current converter 1 includes bias current source 2 coupled to parallel loads 3 and 4, which may comprise resistors. Loads 3 and 4 are respectively coupled to a source of p-channel metal oxide semiconductor (PMOS) transistor 5 and to a source of PMOS transistor 6. Voltage signal $V_{data}$ is applied to a gate of transistor 5 and $V_{data\#}$ is applied to a gate of transistor 6. By virtue of this configuration, voltage-to-current converter 1 converts voltage signal $V_{data}$ to differential current signal $I_{data}$ and outputs $I_{data}$ from a drain terminal of transistor 6. Similarly, converter 1 converts voltage signal $V_{data\#}$ to differential current signal $I_{data\#}$ and outputs $I_{data\#}$ from a drain terminal of transistor 5. In a case that converter 1 performs a substantially linear conversion, differential current signals $I_{data}$ and $I_{data\#}$ together represent a current signal that substantially encodes any data encoded by the differential-mode voltage signal represented by differential voltage signals $V_{data}$ and $V_{data\#}$.

Figure 2:
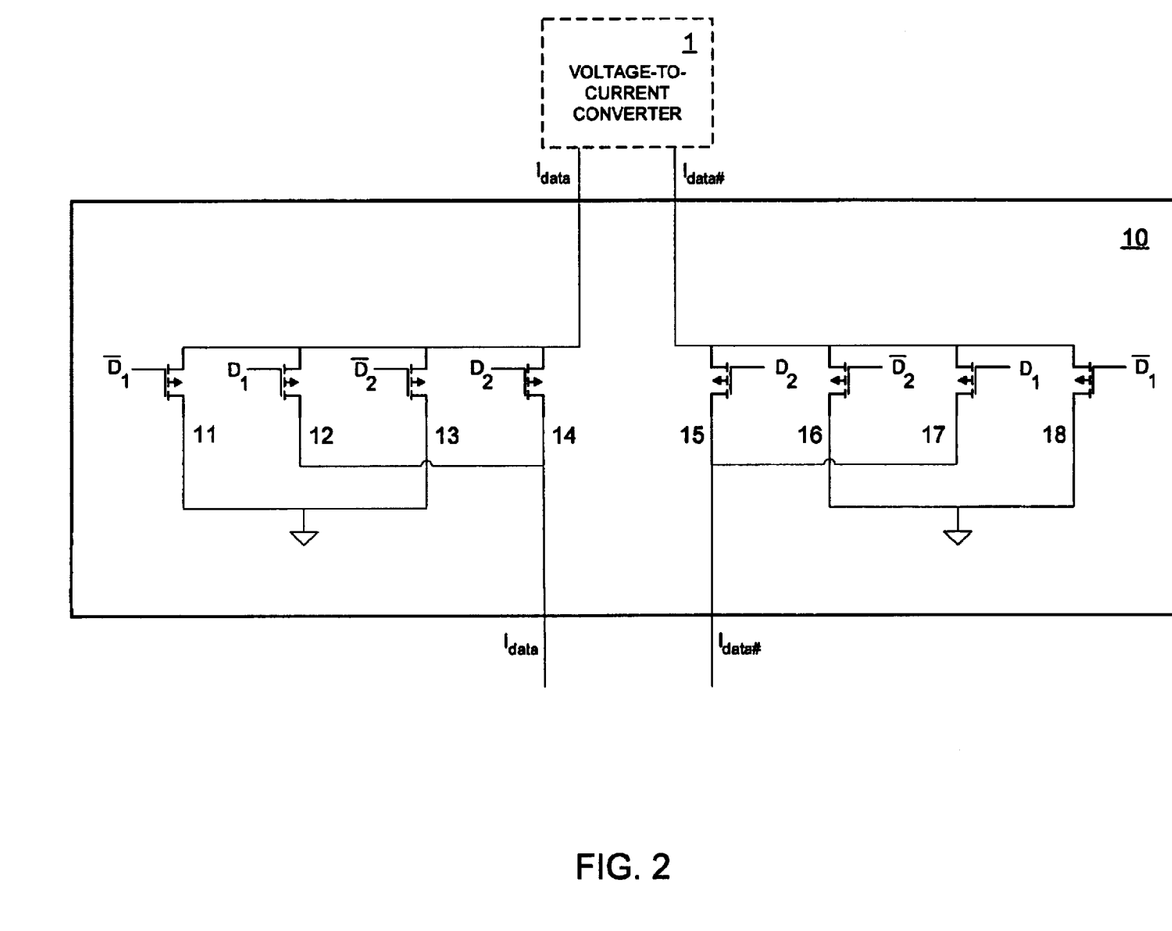
FIG. 2 is a diagram of a weighting unit according to some embodiments.

FIG. 2 illustrates voltage-to current converter 1 and elements of weighting unit 10 according to some embodiments. Weighting unit 10 is adapted to modulate differential current signals $I_{data}$ and $I_{data\#}$ received from converter 1 based on one-bit control signals $D_1$ and $D_2$. Accordingly, weighting 10 may be characterized as a current-steering digital-to-analog converter.

As shown, current signal $I_{data}$ is applied to source terminals of PMOS transistors 11 through 14 and current signal $I_{data\#}$ is applied to source terminals of PMOS transistors 15 through 18. Control signals $D_1$ and $D_2$ are applied as shown to base terminals of transistors 11 through 18, wherein $\overline{D_i}$ denotes the Boolean complement of $D_i$. The weights applied to current signals $I_{data}$ and $I_{data\#}$ are therefore determined by control signals $D_1$ and $D_2$ and the relative channel width-to-length ratios of transistors 11 through 18. For example, when $D_1$ and $D_2$ are both HIGH, signals received from converter 1 are shunted to ground and the effective multiplication value, or weighting, is zero.

In the illustrated embodiment, the channel width-to-length ratio of transistors 13 through 16 is twice the channel width-to-length ratio of transistors 11, 12, 17 and 18. Therefore, the effective multiplication value is one in a case that $D_1$ is LOW and $D_2$ is HIGH, two in a case that $D_1$ is HIGH and $D_2$ is LOW, and three in a case that both $D_1$ and $D_2$ are LOW. Although weighting unit 10 of FIG. 2 utilizes two one-bit control signals (or one two-bit signal), some embodiments may operate in conjunction with control signals of other bit lengths. Also, the above-described channel width-to-length ratios need not be based on powers of two. The combination of voltage-to-current converter 1 and weighting unit 10 realizes a weighting of the input differential-mode voltage signal represented by differential voltage signals $V_{data}$ and $V_{data\#}$. Several of these combinations may be implemented in conjunction with one another to yield a simple filter that can be used within a more-complex filter according to some embodiments.

Figure 3:
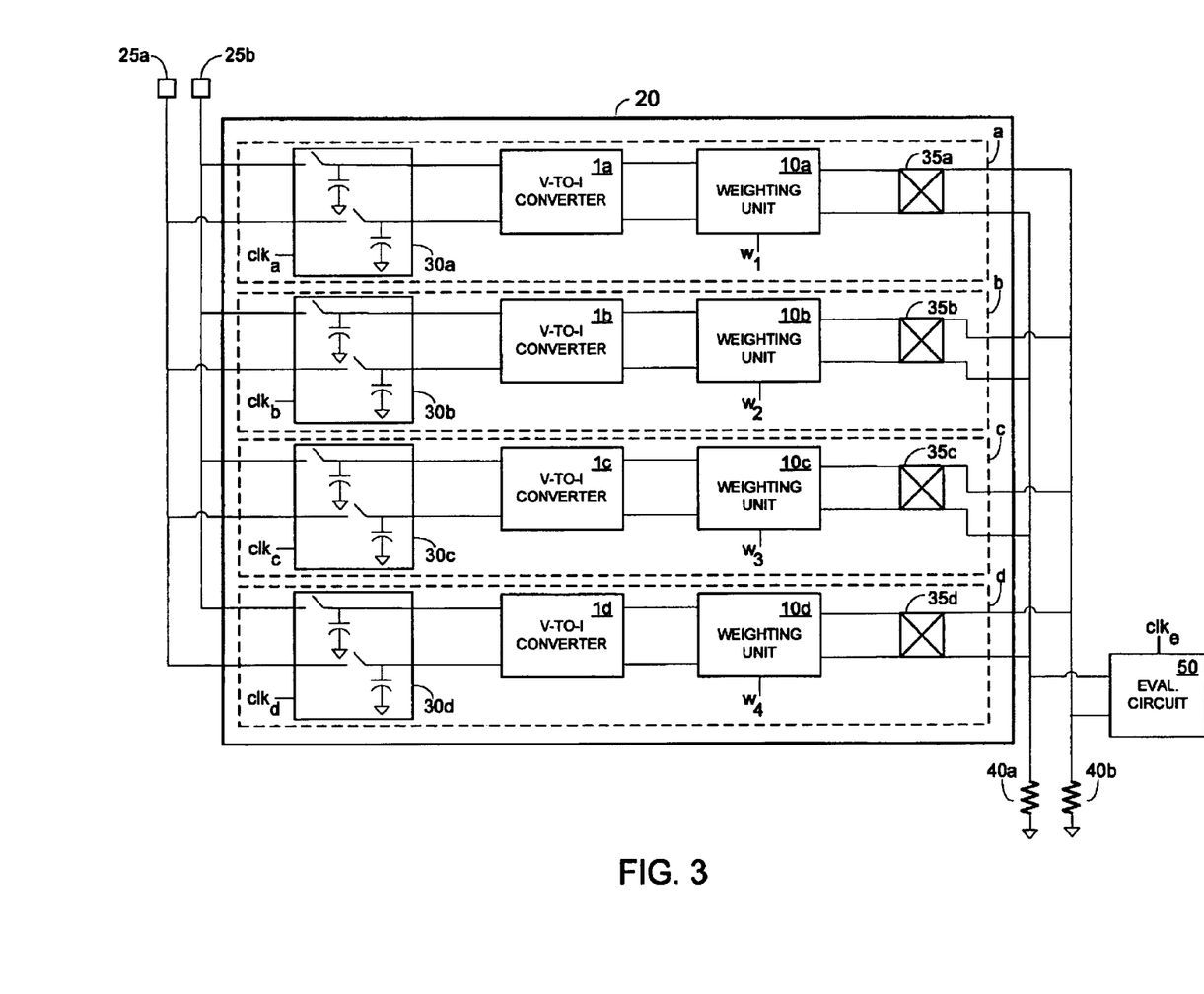
FIG. 3 is a diagram illustrating elements of a filter according to some embodiments.

FIG. 3 illustrates one embodiment of such a filter. Filter 20 includes input ports 25a and 25b and filter taps a through d. Each of taps a through d comprises an instance of samplers 30, voltage-to-current converter 1, weighting unit 10 and sign element 35.

Input ports 25a and 25b receive a differential voltage signal from a transmission line. Samplers 30a through 30d sample the differential signal according to their respective control, or clock, signals $clk_a$ through $clk_d$. Samplers 30a through 30d each consist of two switches connected to respective capacitors. In operation, the switches are closed upon receipt of a HIGH control signal, and are opened when the control signal is LOW. Accordingly, the capacitors of each of samplers 30a through 30d store a sample of the differential voltage signal to which the capacitor is connected while the control signal is HIGH.

As described with respect to FIG. 1, voltage-to-current converters 1a through 1d convert differential voltage signals $V_{data}$ and $V_{data\#}$ to differential current signals $I_{data}$ and $I_{data\#}$. Signals converted by converters 1a through 1d may differ depending on differences in the timing of the control signals input to samplers 30a through 30d. That is, although converters 1a through 1d according to some embodiments may be identical, the signal samples upon which they operate, and therefore their outputs, may differ.

Weighting units 10a through 10d modulate signals received from respective converters 1a through 1d based on respective weighting coefficients $w_1$ through $w_4$. In a case that coefficients $w_1$ through $w_4$ are two-bit signals, units 10a through 10d may be substantially similar to unit 10 of FIG. 2. Each weighting unit is coupled to one of sign elements 35a through 35c. Sign elements 35a through 35c may comprise two-by-two crossbar switches, and are used to effectively reverse the sign of one of weighting coefficients $w_1$ through $w_4$.

Current signals output from sign elements 35a through 35d are summed by convergent signal lines and sunk into loads 40a and 40b. Voltages developed by these loads represent a filtered differential voltage signal that is input to differential evaluation circuit 50, which may comprise a differential latch. Circuit 50 effectively converts the differential voltage signal into a logic signal indicative of whether a "1" or a "0" was received from the transmission line. In operation, a control signal $clk_e$, is transmitted to evaluation circuit 50 at an appropriate timing in order to prepare circuit 50 to evaluate an incoming differential voltage signal.

Figure 4:
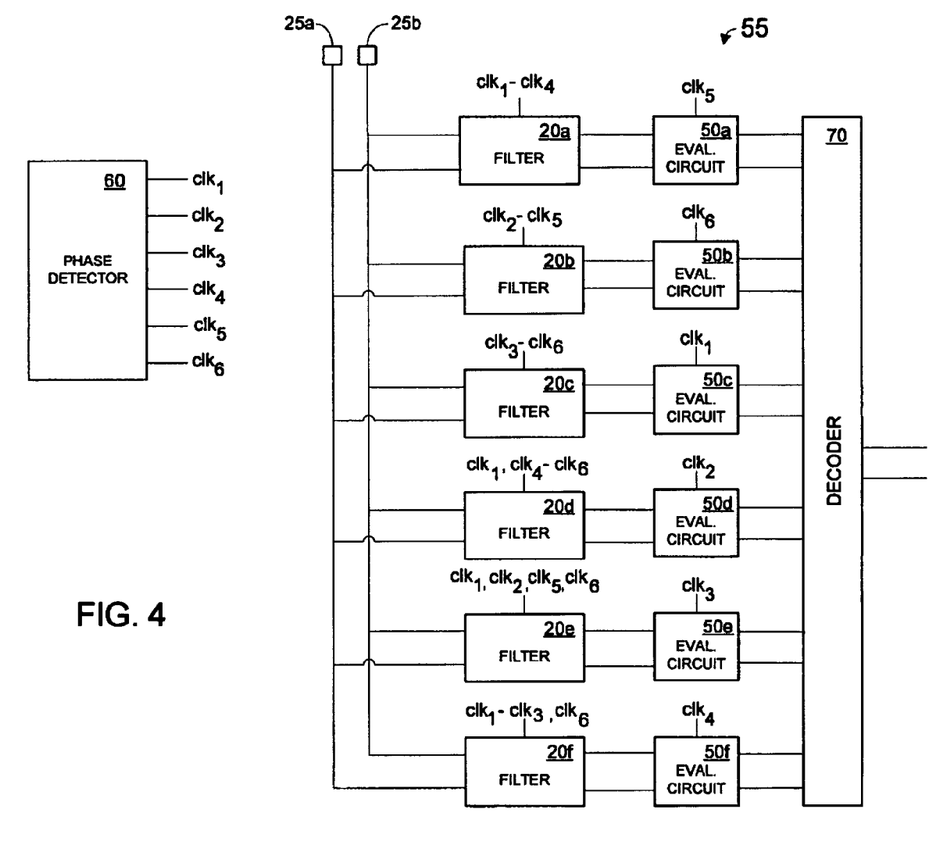
FIG. 4 is a diagram illustrating elements of a filter according to some embodiments.

FIG. 4 illustrates elements of a filter according to some embodiments. Filter 55 includes instances 20a through 20f of filter 20 of FIG. 3, and instances 50a through 50f of evaluation circuit 50 of FIG. 3. Each of filters 20a through 20f receives differential voltage signals $V_{data}$ and $V_{data\#}$ from input ports 25a and 25b.

Also shown in FIG. 4 are phase generator 60 and decoder 70. Phase generator operates to output control signals $clk_1$, through $clk_6$ according to some embodiments. The control signals illustrated in FIG. 4 are single-ended for the sake of clarity, but differential control signals may be used. The control signals may be identical, with consecutive ones of the signals equally out of phase from one another. Phase generator 60 outputs six control signals in the present example, with each control signal associated with an equal signal period.

Decoder 70 receives output from each of evaluation circuits 50a through 50f. Each output reflects a sum of weighted signal samples. As will be described below, only one output per signal period will represent a valid filtered output. Decoder 70 therefore is controlled to determine the valid output in order to generate a filtered differential-mode signal corresponding to the differential-mode voltage signal represented by voltage signals $V_{data}$ and $V_{data\#}$.

Figure 5:
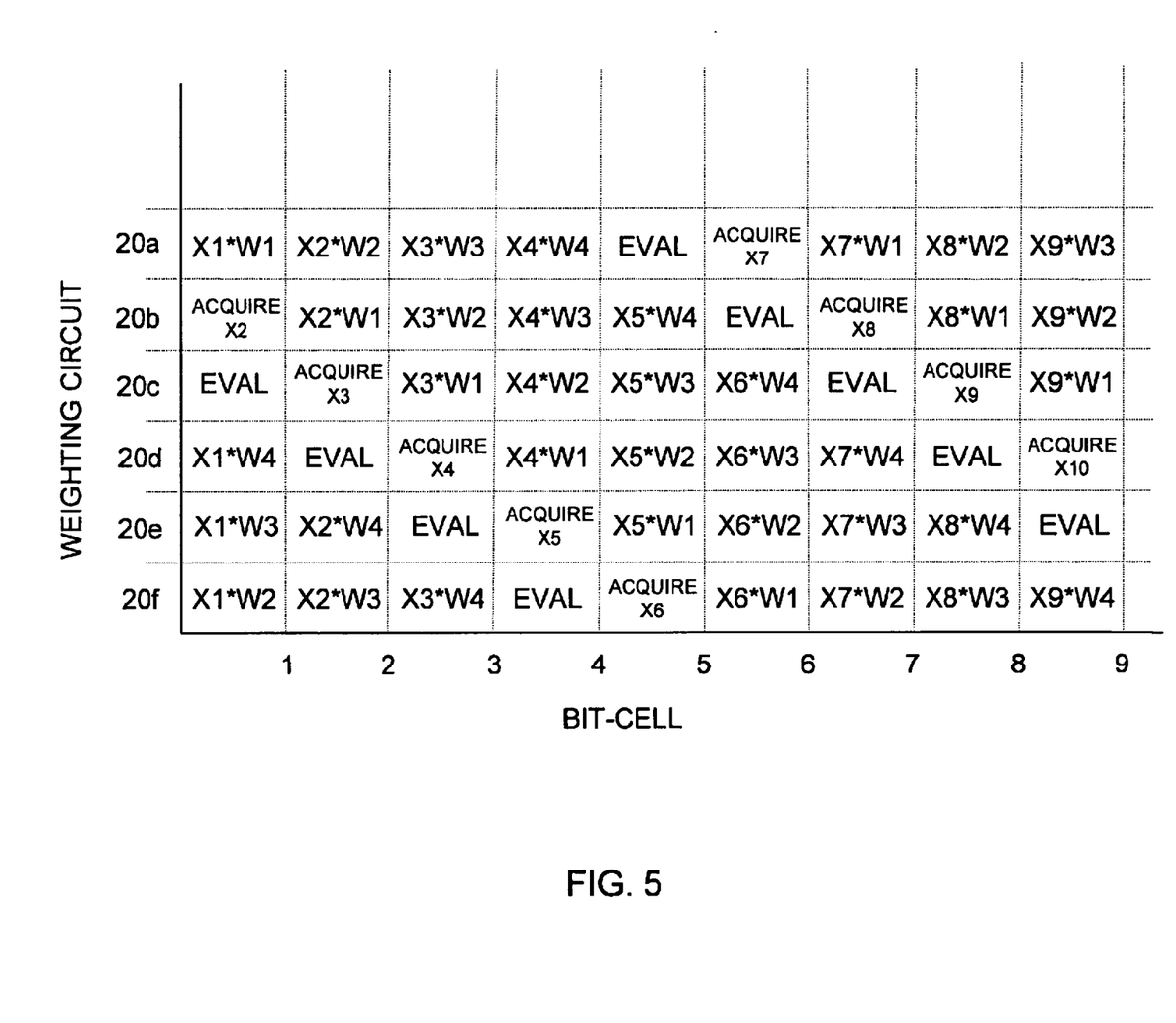
FIG. 5 is a diagram illustrating timings according to some embodiments.

Different sets of control signals are input to each of filters 20a through 20f. More particularly, each tap a through d of each filter 20a through 20f receives a control signal intended to effect a convolution over time as shown in FIG. 5. The convolution is also implemented by inputting appropriate ones of control signals $clk_1$ through $clk_6$ to each of evaluation circuits 50a through 50f so that the circuits generate outputs once each sampler of an associated filter has acquired a new signal sample to be modulated.

As shown in FIG. 5, evaluation circuit 50 requires one bit-cell of time to evaluate and yield an output signal. Although samplers 30b through 30d may acquire new signal samples while taps a through c, respectively, are modulating received signal samples, sampler 30a also requires one bit-cell delay to acquire a new sample at high frequencies in cases where the clock is running at one-half the data rate. As a result, six (four +two) filters are used for this particular arrangement. Other numbers of filters may be used in this or another arrangement. For example, five filters may be used (and the "Acquire" state is not used) in a case that the clock is running at the data rate. Other arrangements may also incorporate evaluation and/or acquire states having a duration of less than one bit-cell.

The table below specifies an arrangement of control signals $clk_1$ through $clk_6$ within the elements of FIG. 4 according to some embodiments. The table specifies the signal period, or bit-cell, associated with each control signal, the sampler of each filter to which each control signal is input, and the evaluation circuit to which each control signal is input.

| control signal | bit-cell | filter 20a | filter 20b | filter 20c | filter 20d | filter 20e | filter 20f | eval. circuit |
|---|---|---|---|---|---|---|---|---|
| $clk_1$ | 1,7, . . . | 30a | — | — | 30d | 30c | 30b | 50c |
| $clk_2$ | 2,8, . . . | 30b | 30a | — | — | 30d | 30c | 50d |
| $clk_3$ | 3,9, . . . | 30c | 30b | 30a | — | — | 30d | 50e |
| $clk_4$ | 4,10, . . . | 30d | 30c | 30b | 30a | — | — | 50f |
| $clk_5$ | 5,11, . . . | — | 30d | 30c | 30b | 30a | — | 50a |
| $clk_6$ | 6,12, . . . | — | — | 30d | 30c | 30b | 30a | 50b |

Figure 6:
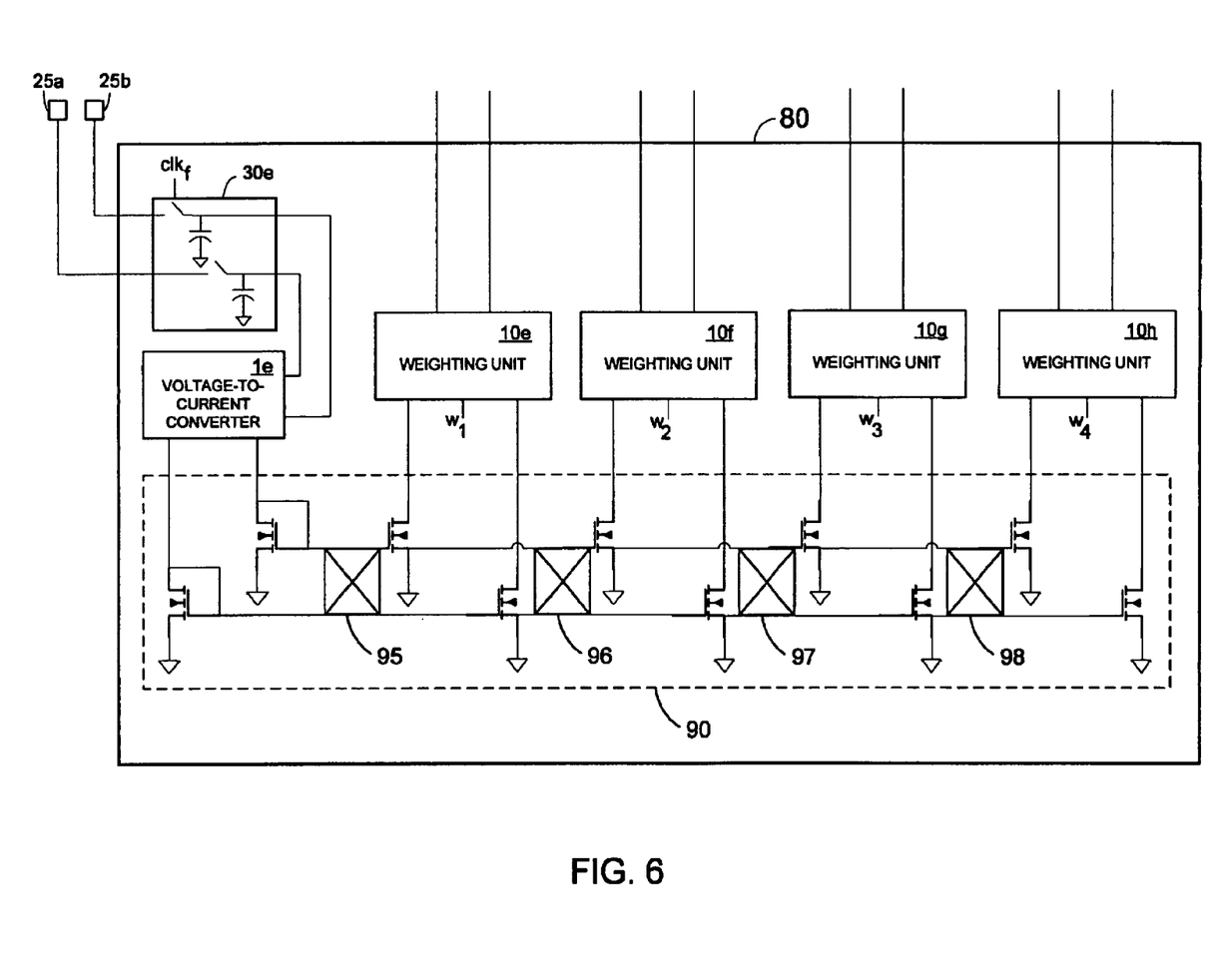
FIG. 6 is a diagram illustrating elements of a weighting circuit according to some embodiments.

FIG. 6 illustrates a weighting circuit according to other embodiments. As described with respect to filter 20, weighting circuit 80 also receives differential voltage signals $V_{data}$ and $V_{data\#}$ from input ports 25a and 25b. However, weighting circuit 80 includes one sampler 30e controlled by one control signal $clk_e$. Sampled signals are converted by voltage-to-current converter 1e and transmitted to current mirror 90.

Current mirror 90 is comprised of n-channel metal oxide semiconductor transistors and is adapted to generate four current signals substantially identical to the sampled differential current signals received from converter 1e. According to some embodiments of mirror 90, the generated signals are amplified versions of the received signals. Current mirror 90 includes sign elements 95 through 98 that may be used as described above to reverse the sign of a weighting coefficient. In this regard, each of the four signals generated by mirror 90 is transmitted to one of weighting units 10e through 10h for modulation according to one of weighting coefficients $w_1$ through $w_4$.

Figure 7:
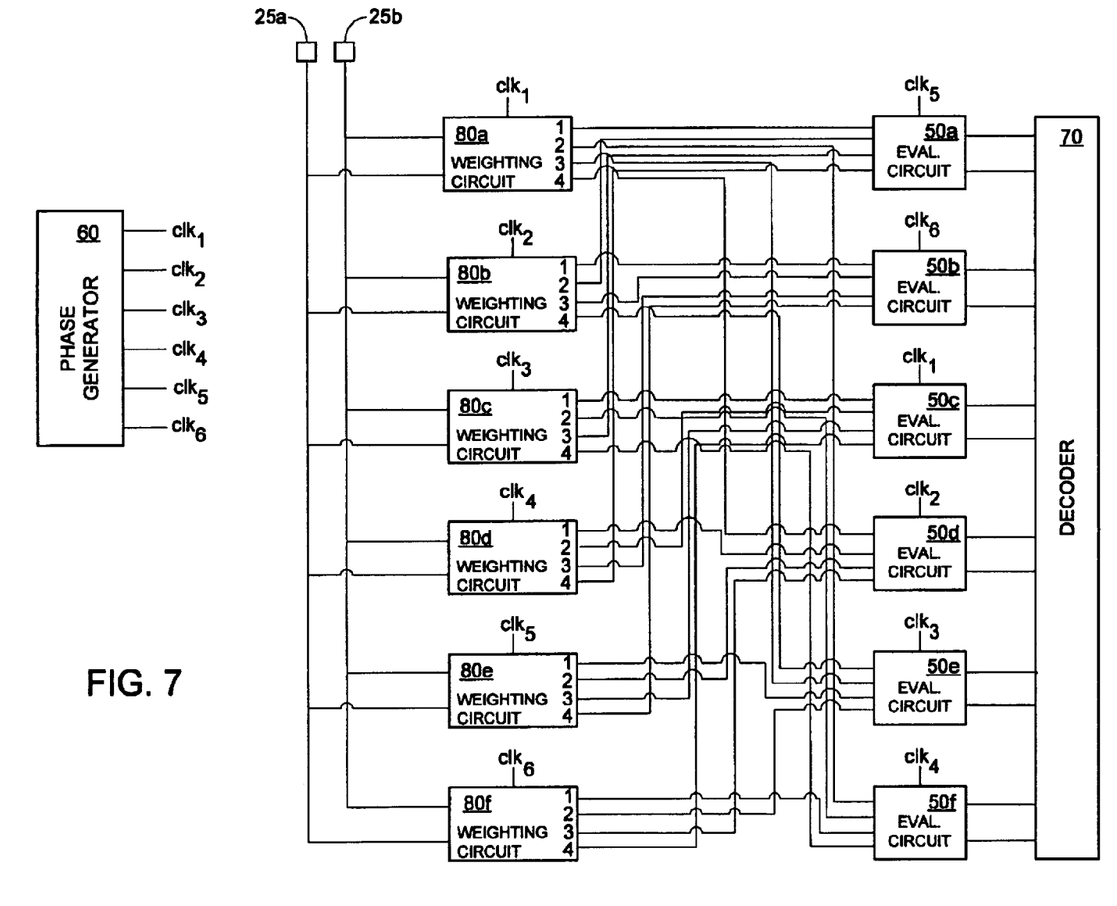
FIG. 7 is a diagram illustrating elements of a filter according to some embodiments.

FIG. 7 illustrates a filter composed of several instances of weighting circuit 80. For purposes of clarity, the control signals output by phase generator 60 and the signals output by weighting circuits 80a through 80f are illustrated as single-ended signals. Each of weighting circuits 80a through 80f receives a control signal from phase generator 60. Instead of outputting a single summed signal to an associated evaluation circuit 50 as shown in FIG. 4, each of weighting circuits 80a through 80f outputs four weighted signals to four different ones of evaluation circuits 50a through 50f. Evaluation circuits 50a through 50f and decoder 70 may operate as described with respect to FIG. 5.

Numbers located adjacent to the output lines of weighting circuits 80a through 80f indicate weighting coefficients applied to signals carried by those lines. For example, the output line adjacent to the number "3" of weighting circuit 80d carries a signal modulated according to weighting coefficient $W_3$. Since weighting circuit 80d receives control signal $clk_4$, the signal represents "X4*W3" according to the notation of FIG. 5.

The FIG. 7 arrangement may therefore be used to implement the timings shown in FIG. 5. The use of current mirror 90 within weighting circuits 80a through 80f reduces a required number of voltage-to-current converters 1. Such a reduction may address power supply headroom and power consumption issues.

Figure 8:
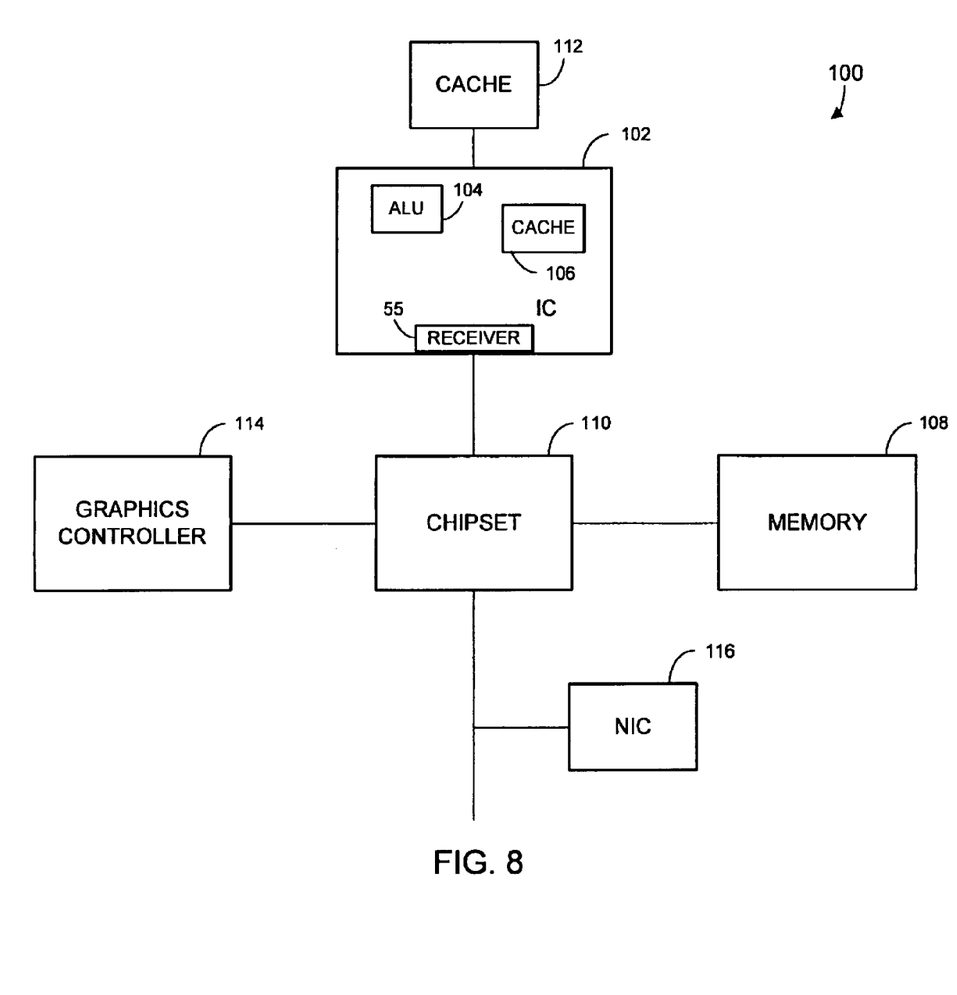
FIG. 8 is a block diagram of a system according to some embodiments.

FIG. 8 illustrates a block diagram of system 100 according to some embodiments. System 100 includes integrated circuit 102 comprising sub-blocks such as arithmetic logic unit (ALU) 104, on-die cache 106 and filter 55 of FIG. 4. Integrated circuit 102 may be a microprocessor or another type of integrated circuit. Integrated circuit 102 may also communicate with system memory 108 through filter 55, a host bus and chipset 110. According to some embodiments, integrated circuit 102 also communicates with off-die cache 112 through filter 55. Other off-die functional units, such as graphics controller 114 and Network Interface Controller (NIC) 116, may communicate with integrated circuit 102 via appropriate busses or ports.

Thus, embodiments may reduce power requirements by filtering using fixed weighting coefficients and signal samples.

The several embodiments described herein are solely for the purpose of illustration. For example, although the above embodiments are described in conjunction with differential signaling, some embodiments may be used in conjunction with single-ended and/or pseudo-differential signaling. Samplers, voltage-to-current converters, current multipliers, sign elements and evaluation circuits other than those described above may be used in some embodiments, and each of these elements need not be identical across and/or within weighting circuits. Moreover, the ground-referenced PMOS transistors described herein may be substituted with $V_{cc}$-referenced n-channel metal oxide semiconductor transistors, and the current sources may be replaced with current sinks. Therefore, persons skilled in the art will recognize from this description that other embodiments may be practiced with various modifications and alterations.

What is claimed is:

1. A device comprising:
    a phase generator to generate m control signals, each of the m control signals to represent a respective signal period;
    at least m filters, each of the at least m filters comprising m-n taps, each of the m-n taps to receive one of the m control signals, to acquire a sample of a data signal according to the signal period represented by the received control signal, and to modulate the sample according to a weighting coefficient input to the tap; and
    at least m evaluation circuits, each circuit associated with a respective one of the at least m filters and to output a sum of samples modulated by the taps of the associated filter in response to one of the m control signals that represents the signal period that is different from the signal periods according to which the samples were acquired.

2. A device according to claim 1 wherein n is a sum of a number of signal periods for one of the at least m evaluation circuits to output the sum of samples and a number of signal periods to acquire the sample.

3. A device according to claim 1, wherein the weighting coefficient input to one tap of one of the at least m filters is associated with one tap of each other of the at least m filters.

4. A device according to claim 3, wherein the weighting coefficient input to each tap of one of the at least m filters is input to one tap of each other of the at least m filters.

5. A device according to claim 1, wherein the control signal to be received by one tap of one of the at least m filters is to be received by one tap of each other of the at least m filters.

6. A device according to claim 5, wherein the control signal to be received by each tap of one of the at least m filters is to be received by one tap of each other of the at least m filters.

7. A device according to claim 1, wherein each of the m evaluation circuits is to receive a respective one of the m control signals.

8. A device according to claim 1, wherein in the case of a first control signal, one tap of each of m-n of the at least m filters is to receive the first control signal, to acquire a first sample according to a first signal period represented by the first control signal, and to modulate the first signal sample according to the weighting coefficient input to the one tap.

9. A device according to claim 8, wherein the evaluation circuit associated with one of the remaining n filters is to receive the first control signal and to output a first sum of weighted samples in response to the first control signal.

10. A device according to claim 1, wherein each of the m signal periods is of equal duration.

11. A device according to claim 1, wherein each of the m-n taps of each of the at least m filters comprises a voltage sampler, a voltage-to-current converter and a weighting unit to multiply the sample acquired by the tap by a weighting coefficient input to the tap.

12. A device comprising:
    a phase generator to generate m control signals, each of the m control signals to represent a respective signal period;
    at least m weighting circuits, each of the at least m weighting circuits to receive a respective one of the m control signals, to acquire a sample of a data signal according to a signal period represented by the respective one of the m control signals, and comprising m-n weighting units, each of the m-n weighting units of one of the at least m weighting circuits to modulate the acquired sample according to a weighting coefficient input to the weighting unit; and
    at least m evaluation circuits, each evaluation circuit to receive one weighted sample from m-n weighting circuits and to output a sum of the received samples in response to one of the m control signals that represents the signal period that is different from the signal periods according to which the samples were acquired.

13. A device according to claim 12, wherein n is a sum of a number of signal periods for one of the at least m evaluation circuits to output the sum of samples and a number of signal periods to acquire the sample.

14. A device according to claim 12, wherein the weighting coefficient input to one of the m-n weighting units of one of the at least m weighting circuits is input to one tap of each other of the at least m weighting circuits.

15. A device according to claim 14, wherein the weighting coefficient input to each of the m-n weighting units of one of the at least m weighting circuits is input to one weighting unit of each other of the at least m weighting circuits.

16. A device according to claim 12, wherein each of the m evaluation circuits is to receive a respective one of the m control signals.

17. A device according to claim 12, wherein each of the m signal periods is of equal duration.

18. A device according to claim 12, wherein each of the at least m weighting circuits comprises a voltage sampler, a voltage-to-current converter coupled to the voltage sampler, a current mirror coupled to the voltage-to-current converter, and m-n weighting units coupled to the current mirror, each of the m-n weighting units to receive a substantially identical sample from the current mirror and to multiply the sample by a the weighting coefficient input to the weighting unit.

19. A method comprising:
    generating m control signals, each of the m control signals to represent a respective signal period;
    receiving m-n of the m control signals with m-n taps of each of at least m filters;
    acquiring, with each tap, a sample of a data signal according to a signal period represented by the control signal received by the tap;

modulating, with each tap, the sample acquired with the tap according to a weighting coefficient input to the tap; and outputting, from one of at least m evaluation circuits, each evaluation circuit associated with a respective one of the at least m filters, a sum of samples modulated by the taps of the associated filter in response to one of the m control signals that represents a signal period that is different from the signal periods according to which the samples were acquired.

20. A method according to claim 19, wherein n is a sum of a number of signal periods for one of the at least m evaluation circuits to output the sum of samples and a number of signal periods to acquire the sample.

21. A method according to claim 19, wherein the weighting coefficient input to one tap of one of the at least m filters is input to one tap of each other of the at least m filters.

22. A method according to claim 19, wherein the control signal to be received by one tap of one of the at least m filters is to be received by one tap of each other of the at least m filters.

23. A method according to claim 19, wherein each of the m evaluation circuits is to receive a respective one of the m control signals.

24. A method comprising:

generating m control signals, each of the m control signals to represent a respective signal period;

acquiring, with each of at least m weighting circuits, each of the at least m weighting circuits to receive a respective one of the m control signals, a sample according to a signal period represented by the respective one of the m control signals;

modulating, with each of m-n weighting units of one of the at least m weighting circuits, the acquired sample according to a weighting coefficient input to the weighting unit;

receiving, with each of at least m evaluation circuits, one weighted sample from each of m-n weighting circuits; and outputting a sum of the received weighted signal samples in response to one of the m control signals that represents the signal period that is different from the signal periods according to which the samples were acquired.

25. A method according to claim 24, wherein each of the at least m weighting circuits comprises a voltage sampler, a voltage-to-current converter coupled to the voltage sampler, a current mirror coupled to the voltage-to-current converter, and m-n weighting units coupled to the current mirror, and further comprising:

receiving, with each of the m-n weighting units, a substantially identical sample from the current mirror, and modulating, with each of the m-n weighting units, the sample with the weighting coefficient input to the weighting unit.

26. A system comprising:

a chipset; and a die comprising a microprocessor in communication with the chipset, wherein the microprocessor includes a filter comprising:

a phase generator to generate m control signals, each of the m control signals to represent a respective signal period;

at least m filters, each of the at least m filters comprising m-n taps, each of the m-n taps to receive one of the m control signals, to acquire a sample of a data signal according to a signal period represented by the received control signal, and to modulate the sample according to a weighting coefficient input to the tap; and at least m evaluation circuits, each circuit associated with a respective one of the at least m filters and to output a sum of samples modulated by the taps of the associated filter in response to one of the m control signals that represents the signal period that is different from the signal periods according to which the signal samples were acquired.

27. A system according to claim 26, wherein in the case of a first control signal, one tap of each of m-n of the at least m filters is to receive the first control signal, to acquire a first sample according to a first signal period represented by the first control signal, and to modulate the first sample according to the weighting coefficient input to the one tap.

28. A system according to claim 27, wherein the evaluation circuit associated with one of the remaining n filters is to receive the first control signal and to output a first sum of weighted samples in response to the first control signal.

29. A system comprising:

a chipset; and a die comprising a microprocessor in communication with the chipset, wherein the microprocessor includes a filter comprising:

a phase generator to generate m control signals, each of the m control signals to represent a respective signal period;

at least m weighting circuits, each of the at least m weighting circuits to receive a respective one of the m control signals, to acquire a sample of a data signal according to a signal period represented by the respective one of the m control signals, and comprising m-n weighting units, each of the m-n weighting units of one of the at least m weighting circuits to modulate the acquired sample according to a weighting coefficient input to the weighting unit; and at least m evaluation circuits, each evaluation circuit to receive one weighted sample from m-n weighting circuits and to output a sum of the received samples in response to one of the m control signals that represents the signal period that is different from the signal periods according to which the samples were acquired.

30. A system according to claim 29, wherein each of the at least m weighting circuits comprises a voltage sampler, a voltage-to-current converter coupled to the voltage sampler, a current mirror coupled to the voltage-to-current converter, and m-n weighting units coupled to the current mirror, each of the m-n weighting units to receive a substantially identical sample from the current mirror and to multiply the sample by the weighting coefficient input to the weighting unit.

* * * * *